US008698205B2

(12) United States Patent
Tzeng et al.

(10) Patent No.: US 8,698,205 B2
(45) Date of Patent: Apr. 15, 2014

(54) INTEGRATED CIRCUIT LAYOUT HAVING MIXED TRACK STANDARD CELL

(75) Inventors: Jiann-Tyng Tzeng, Hsinchu (TW);
Chih-Liang Chen, Hsinchu (TW);
Yi-Feng Chen, Xinpu Township (TW);
Kam-Tou Sio, Hsinchu (TW);
Shang-Chih Hsieh, Yangmei (TW);
Helen Shu-Hui Chang, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 18 days.

(21) Appl. No.: 13/481,270

(22) Filed: May 25, 2012

(65) Prior Publication Data

US 2013/0313615 A1  Nov. 28, 2013

(51) Int. Cl.
*H01L 27/10* (2006.01)
*H01L 27/108* (2006.01)
*H01L 29/76* (2006.01)
*H01L 29/94* (2006.01)
*H01L 31/119* (2006.01)
*H01L 27/082* (2006.01)
*H01L 27/102* (2006.01)

(52) U.S. Cl.
USPC ....... 257/206; 257/296; 257/574; 257/E27.01

(58) Field of Classification Search
USPC ......... 257/202–211, 258, 658, 909–911, 918,
257/5, 59, 72, 88–97, 291–294, 390–391,
257/443–448, E27.026–E27.027,
257/E27.046–E27.11, E27.121,
257/E27.124–126, E27.133–E27.14,
257/E25.003–E25.028, E27.001–E27.163,
257/E25.001–E25.032, E21.598–E21.704,
257/E21.63–E21.644, 296, 574, E27.01;
438/34–35, 73–81, 109, 128, 381–399,
438/587, 982, 66–67; 326/101–103
See application file for complete search history.

(56) References Cited

U.S. PATENT DOCUMENTS

| | | | | |
|---|---|---|---|---|
| 5,489,860 A * | 2/1996 | Kitagawa et al. | ............. | 326/103 |
| 6,838,713 B1 | 1/2005 | Gheewala et al. | | |
| 6,849,906 B2 * | 2/2005 | Maeno et al. | ................. | 257/390 |
| 7,129,562 B1 * | 10/2006 | Gheewala et al. | ............ | 257/574 |
| 7,564,077 B2 * | 7/2009 | Ko et al. | ......................... | 257/206 |
| 7,930,658 B2 * | 4/2011 | Yoshioka | ........................ | 716/54 |
| 8,357,955 B2 * | 1/2013 | Tanaka | ........................... | 257/206 |
| 2003/0160268 A1 * | 8/2003 | Wagner et al. | ................ | 257/207 |
| 2004/0153986 A1 * | 8/2004 | Sahara et al. | ................. | 716/10 |
| 2007/0141766 A1 * | 6/2007 | Sekido et al. | ................ | 438/154 |
| 2007/0200238 A1 * | 8/2007 | Ikegami et al. | ............... | 257/734 |
| 2008/0186059 A1 * | 8/2008 | Nozoe | ........................... | 326/103 |
| 2009/0033368 A1 * | 2/2009 | Pitts | ............................. | 326/101 |
| 2010/0148219 A1 * | 6/2010 | Shimizu | ........................ | 257/207 |
| 2010/0162187 A1 * | 6/2010 | Penzes et al. | ..................... | 716/2 |
| 2010/0289111 A1 * | 11/2010 | Lee et al. | ...................... | 257/499 |

* cited by examiner

*Primary Examiner* — David S Blum
(74) *Attorney, Agent, or Firm* — Lowe Hauptman & Ham, LLP

(57) ABSTRACT

An integrated circuit layout having a mixed track standard cell configuration that having a mixed track standard cell configuration that includes first well regions of a predetermined height and second well regions of a predetermined height, the first and second well regions are arranged within a substrate, first conductors and second conductors arranged and extending across regions of corresponding first and second well regions, and a plurality of standard cells in multiple rows. The standard cells include a first substantially equal to standard cell having a first cell height substantially equal to $I(X+Y)+X$ or Y, wherein X is one half the predetermined height of the first well region, Y is one half the predetermined height of the second well region, and I is a positive integer.

20 Claims, 3 Drawing Sheets

INTEGRATED CIRCUIT LAYOUT HAVING MIXED TRACK STANDARD CELL

BACKGROUND

Typically, in the design of integrated circuits, standard cells having fixed functions are used. Pre-designed standard cells are stored in cell libraries. When designing integrated circuits, the standard cells are retrieved from the cell libraries and placed into desired locations on an integrated circuit layout. Routing is then performed to connect the standard cells with each other and with other cells using a routing grid which defines horizontal and vertical tracks where metal routing is formed. The tracks are used to route signal (interconnect) lines for passing signals between the cells. A standard cell's height is determined by the number of horizontal grid lines ("tracks") extending between the uppermost and lowermost points of the cell, and the cell's width is determined by vertical grid lines ("poly pitches") extending between the leftmost and rightmost points of the cell. Typically, to facilitate the placement and routing process, most cells of a standard cell library have the same height or a multiple thereof, and the uppermost and lowermost horizontal tracks are reserved for conductive lines. Standard cells typically range in height from approximately 7 to 15 tracks. A smaller cell height results in a higher gate density with smaller transistors, while a larger cell height may be implemented to handle applications requiring more cell drive current.

A standard cell design may include a single height cell that occupies an area from a positive power supply line ("VDD") to a negative power supply line ("VSS"). Two single smaller height cells may be stacked together to form a dual height cell in cases where larger transistors are needed, and in order to increase performance. Further, multi-row standard cell structures are intermixed with both the single, smaller height cells and the dual height cells to accommodate both high gate density applications and higher-drive current applications.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
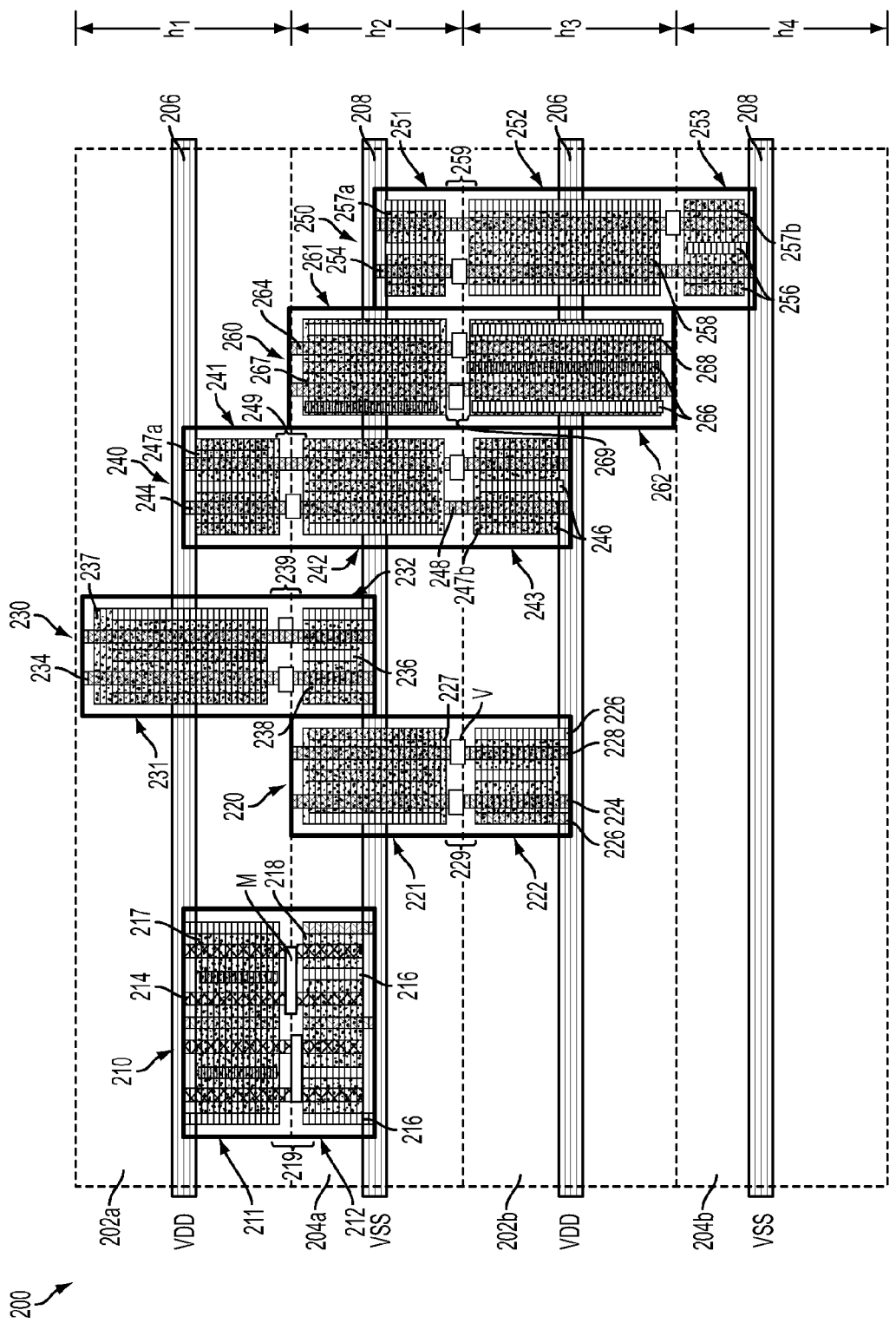
FIG. 1 is a layout view of an integrated circuit layout having a mixed track standard cell configuration in accordance with one or more embodiments.

It is understood that the following disclosure comprises many different embodiments, or examples, for implementing different features of the disclosure. Specific examples of components and arrangements are described below to simplify the present disclosure. These are, of course, examples and are not intended to be limiting. In accordance with the standard practice of the industry, various features in the drawings are not drawn to scale and are used for illustration purposes only.

Spatially relative terms, for example, "lower", "upper", "horizontal", "vertical", "above", "below", "up", "down", "top", "bottom", etc. as well as derivatives thereof (e.g., "horizontally", "downwardly", "upwardly", etc.) are used for ease of the present disclosure of one feature's relationship to another feature. The spatially relative terms are intended to cover different orientations of the device including the features.

FIG. 1 is a layout view of an integrated circuit layout having a mixed track standard cell structure 200 in accordance with one or more embodiments. The mixed track standard cell structure 200 is a multi-row structure having a plurality of standard cells of varying cell heights. The mixed track standard cell structure 200 includes a plurality of first well regions (i.e., N well regions) 202a and 202b and a plurality of second well regions (i.e., P well regions) 204a and 204b alternately arranged within a substrate. Predetermined heights of the N well regions 202a and 202b are referred to as $h_1$ and $h_3$ and predetermined heights of the P well regions 204a and 204b are referred to as $h_2$, and $h_4$. The predetermined heights $h_1$, $h_2$, $h_3$ and $h_4$ are substantially equal to each other, e.g., each height is substantially equal to 8 tracks. In other embodiments, the predetermined heights $h_1$, $h_2$, $h_3$ and $h_4$ vary, e.g., the predetermined heights $h_1$ and $h_3$ of the N well regions 202a and 202b are 8 tracks and the predetermined heights $h_2$, and $h_4$ of the P well regions 204a and 204b are 10 tracks. The mixed track standard cell structure 200 further includes a plurality of first conductive traces (i.e., conductors) 206 and a plurality of second conductive traces 208 forming power rails. The conductors 206 are coupled to a first power supply VDD and the conductors 208 are coupled to a second power supply VSS and both the conductors 206 and 208 are alternately arranged and extend across the mixed track standard cell structure 200. Each conductor 206 extends across a center region of each N well region 202a and 202b and each conductor 208 extends across a center region of each P well region 204a and 204b. In one or more alternate embodiments, mixed track standard cell structure 200 comprises greater or fewer number of conductors 206 and 208.

The plurality of standard cells includes cells 210, 220, 230, 240, 250 and 260. The cells 210 through 260 are disposed in multiple rows and comprise different cell heights varying in height by a multiple of four track (4T) units. The cells 210 through 260 have cell heights ranging from approximately 8 tracks to approximately 16 tracks. It also can be extend to any cells whose height is a multiple of 4 tracks. In other embodiments, cells 210 through 260 have cell heights from 2 tracks to more than 20 tracks.

The first standard cell 210 is a single height cell having a first cell height of a predetermined number of tracks. The first cell height is determined using the following equation:

$$X+Y \qquad \text{Equation 1}$$

Where $X=\frac{1}{2}$ (predetermined height $h_1$ or $h_3$), and $Y=\frac{1}{2}$ (predetermined height $h_2$ or $h_4$)

In one example using Equation 1, if $h_1=8$ and $h_2=8$, then first cell height is eight tracks (8T).

Further, the first cell height is substantially equal to the total distance between the first conductor 206 and the second conductor 208. The uppermost and lowermost cell boundaries of the first standard cell 210 abut the first and second conductors 206 and 208. The use of eight track (8T) standard cells, e.g., standard cell 210 shortens the interconnect length for connecting the standard cells to circuit elements on adjacent layers and in other standard cells. In comparison to higher track cells, e.g., nine track (9T) cells, use of the 8T cells enables more effective signal routing and lessens the area requirement needed for interconnection.

The first standard cell 210 includes first and second transistor regions 211 and 212, gate strips 214, source and drain regions 216 and active regions 217 and 218. The first transistor region (i.e., a PMOS region 211) is in the N well region 202a and the second transistor region (i.e., a NMOS region 212) is in the P well region 204a. The p-type active region (referred to as an oxide-dimensioned or "OD region") 217 of the PMOS region 211 is in the N well region 202a and an n-type active region 218 of the NMOS region 212 is in the P well region 204a. The active regions 217 and 218 extend from left to right cell boundaries of cell 210. The active regions 217 and 218 are separated by either a portion of the substrate or an isolation structure 219. The gate strips 214 have source and drain regions 216 disposed on either side thereof. The gate strips 214 form MOS transistor gates and lie over a gate dielectric. Metal portions "M" are coupled to the gate strips 214 to connect circuit elements.

The isolation structure 219 is formed by local oxidation of silicon ("LOCOS"), shallow trench isolation or other suitable process. The gate strips 214 are formed of polysilicon, for example. The gate strips 214 are formed using processing operations of oxide deposition, polysilicon deposition, etching and sidewall formation before or after active source and drain diffusion implantation, thermal annealing, or other suitable process.

The height of the PMOS region 211 is substantially equal to one half the height $h_1$ of the N well region 202a and the height of the NMOS region 212 is substantially equal to one half the height $h_2$ of the P well region 204a. The height of the PMOS region 211 is substantially equal to the height of the NMOS region 212, e.g., the PMOS region 211 includes four tracks and the NMOS region 212 includes four tracks. According to other embodiments, the height of the PMOS region 211 is greater than or less than the height of the NMOS region 212, e.g., the tracks are divided into 3 PMOS tracks and 5 NMOS tracks, or 6 PMOS tracks and 2 NMOS tracks.

The mixed track standard cell structure 200 further includes a plurality of second standard cells 220 and 230. The second standard cells 220 and 230 have a second cell height of a predetermined number of tracks. The second cell height is determined using the following equation:

$$I(X+Y)+X \text{ or } Y \qquad \text{Equation 2}$$

Where $X=\frac{1}{2}$ (predetermined height $h_1$ or $h_3$), $Y=\frac{1}{2}$ (predetermined height $h_2$ or $h_4$), and I is a positive integer.

In one example using Equation 2, assuming $h_1=8$ and $h_2=8$ then $X=4$ and $Y=4$. Thus, if I=1, then the second cell height is 12 tracks (12T). In another example, if X=4, Y=4 and I=2, then the second cell height is twenty tracks (20T).

The second cell height of the second standard cells 220 and 230 are of a height four tracks greater than the first cell height of the first standard cell 210. The second cell height of the second standard cells 220 and 230 is 1.5 times the first cell height of the first standard cell 210.

The second standard cell 220 includes first and second transistor regions 221 and 222, gate strips 224, source and drain regions 226 and active regions 227 and 228. The first transistor region (i.e., a NMOS region 221) is in the P well region 204a and the second transistor region (i.e., a PMOS region 222) is in the N well region 202b. The uppermost cell boundary of the second standard cell 220 abuts an uppermost boundary of the P well region 204a and the lowermost cell boundary of the second standard cell 220 abuts the first conductor 206 in the N well region 202b. The n-type active region 227 of the NMOS region 221 is in the P well region 204a and a p-type active region 228 of the NMOS region 222 is in the N well region 202b. The active regions 227 and 228 extend from left to right cell boundaries and are separated by either a portion of the substrate or isolation structures 229. The height of the NMOS region 221 is greater than the height of the PMOS region 227. The height of the NMOS region 221 is substantially equal to a total height $h_2$ of the P well region 204a and the height of the PMOS region 222 is substantially equal to one half the height $h_3$ of the N well region 202b and abuts the conductor 206. Vias "V" extend through an insulating layer to couple a metal layer to the gate strips 224.

The second standard cell 230 includes first and second transistor regions 231 and 232, gate strips 234, source and drain regions 236 and active regions 237. The first transistor region (i.e., a PMOS region 231) is in the N well region 202a, and the second transistor region (i.e., a NMOS region 232) is in the P well region 204a. A p-type active region 237 of the PMOS region 231 is in the N well region 202a and a n-type active region 238 of the NMOS region 232 is in the P well region 204a. The active regions 237 and 238 are separated by an isolation structure 239. The height of the PMOS region 231 is greater than a height of the NMOS region 232. The height of the PMOS region 231 is substantially equal to a total height $h_1$ of the N well region 202a and the height of the NMOS region 232 is substantially equal to one half the height $h_2$ of the P well region 204a. The uppermost cell boundary of the second standard cell 230 abuts an uppermost boundary of the N well region 202a and the lowermost cell boundary of the second standard cell 230 abuts the second conductor 206 in the P well region 204a.

The mixed track standard cell structure 200 further includes a plurality of third standard cells 240, 250 and 260. Each of the third standard cells 240, 250 and 260 include a third cell height of a predetermined number of tracks. The third cell height is determined using the following equation:

$$2(X+Y) \qquad \text{Equation 3}$$

Where $X=\frac{1}{2}$ (predetermined height $h_1$ or $h_3$), and $Y=\frac{1}{2}$ (predetermined height $h_2$ or $h_4$)

In one example using Equation 3, if $h_2=8$ and $h_3=8$, then the third cell height is sixteen tracks (16T).

The third cell height of the cells 240, 250 and 260 is four tracks greater than the second cell height of the second standard cells 220 and 230. The third cell height of each third standard cells 240, 250 and 260 is of a track number two times the first cell height of the first standard cell 210.

The third standard cell 240 includes first, second and third transistor regions 241, 242 and 243, gate strips 244 surrounded by source and drain regions 246 on either side thereof, and active regions 247a, 247b and 248. The first transistor region (i.e., a PMOS region 241) is in the N well region 202a, the second transistor region (i.e., a NMOS region 242) is in the P well region 204a and the third transistor region (i.e., PMOS region 243) is in the N well region 202b. The two p-type active regions 247a and 247b correspond to the PMOS region 241 and the PMOS region 243. The p-type active region 247a is in the N well region 202a and the p-type active region 247b is in the N well region 202b. Further, the n-type active region 248 of the NMOS region 242 is in the P well region 204a. The active regions 247a, 247b and 248 are separated by isolation structures 249. As shown, a height of the NMOS region 242 is greater than a height of each of the PMOS regions 241 and 243. Further, the height of the NMOS region 242 is substantially equal to a total height $h_2$ of the P well region 204a. The height of the PMOS region 241 is substantially equal to one half the height $h_1$ of N well region 202a and the height of the PMOS region 243 is substantially equal to one half the height $h_3$ of the N well region 202b. The uppermost cell boundary of the third standard cell 240 abuts the first conductor 206 in the N well region 202a, and the lowermost cell boundary of the third standard cell 240 abuts another first conductor 206 in the N well region 202b.

The third standard cell 250 is substantially equal to the third standard cell 240. The third standard cell 250 also includes first, second and third transistor regions 251, 252 and 253, gate regions 254, source and drain regions 256 surrounding the gate regions 254 and on either side thereof, and active regions 257a, 257b and 258. The first transistor region 251 (i.e., a NMOS region 251) is in the P well region 204a, the second transistor region (i.e., a PMOS region 252) is in the N well region 202b, and the third transistor region (i.e., a NMOS region 253) is in the P well region 204b. Two n-type active regions 257a and 257b correspond to the PMOS region 251 and the PMOS region 253. The n-type active region 257a is in the P well region 204a and the n-type active region 257b is in the P well region 204b. Further, the p-type active region 258 of the PMOS region 252 is in the N well region 202b. The active regions 257a, 257b and 258 are separated by isolation structures 259. As shown, a height of the PMOS region 252 is greater than a height of each of the NMOS regions 251 and 253. Further, the height of the PMOS region 252 is substantially equal to the total height $h_3$ of the N well region 202b. The height of the NMOS region 251 is substantially equal to one half the height $h_2$ of the P well region 204a and the height of NMOS region 253 is substantially equal to one half the height $h_4$ of the P well region 204b. The uppermost cell boundary of the third standard cell 250 abuts the second conductor 208 in the P well region 204a, and the lowermost cell boundary of the third standard cell 250 abuts another second conductor 208 in the P well region 204b.

The third standard cell 260 is substantially equal to the first and second standard cells 210, 220 and 230. The third standard cell 260 includes a single pair of transistor regions (i.e., first and second transistor regions 261 and 262), gate strips 264 and source and drain regions 266 on either side of the gate strips and active regions 267 and 268. The first transistor region (i.e., a NMOS region 261) is in the P well region 204a and the second transistor region (i.e., a PMOS region 262) is in the N well region 202b. The uppermost cell boundary of the third standard cell 260 abuts a boundary of the P well region 204a, and the lowermost cell boundary of the third standard cell 260 abuts a boundary of the P well region 204b. The n-type active region 266 of the NMOS region 261 is in the P well region 204a and a p-type active region 267 of the PMOS region 262 is in the N well region 202b. The active regions 266 and 267 are separated by isolation structure 269. The height of the NMOS region 261 is substantially equal to a total height $h_2$ of the P well region 204a and the height of the PMOS region 262 is substantially equal to a total height $h_3$ of the N well region 202b. With all three type cells 240, 250 and 260, they can be more effectively combined with the first and second standard cells 210, 220 and 230 to obtain a more compact area than only the third standard cell 260.

Figure 2:
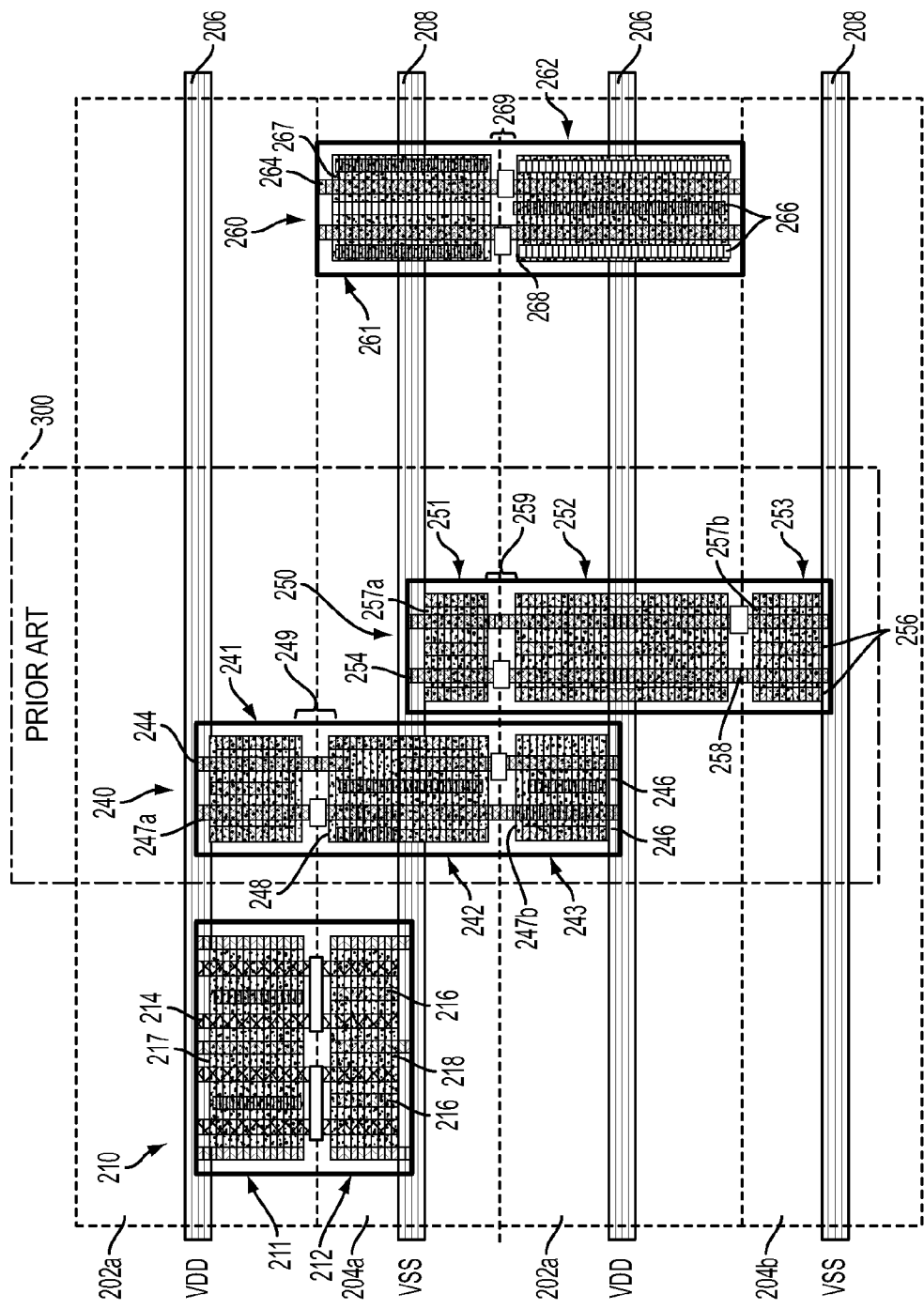
FIG. 2 is a diagram of dual height cells in comparison with standard cells in accordance with one or more embodiments.

FIG. 2 is a diagram of dual height cells 240 and 250 (as outlined by dashed box 300) in comparison with a standard cell 260 in accordance with one or more embodiments. The third standard cell 260 has an increased packing density compared to the cells 240 and 250. The OD region, i.e., the active region 248 of the cell 240 is not fully utilized, thus directly affecting any potential increase in cell drive current. The third standard cell 260 having the single pair of first and second transistors 261 and 262 enables the OD region, i.e., active regions 267 and 268 to be fully utilized, thereby increasing the cell drive current.

Figure 3:
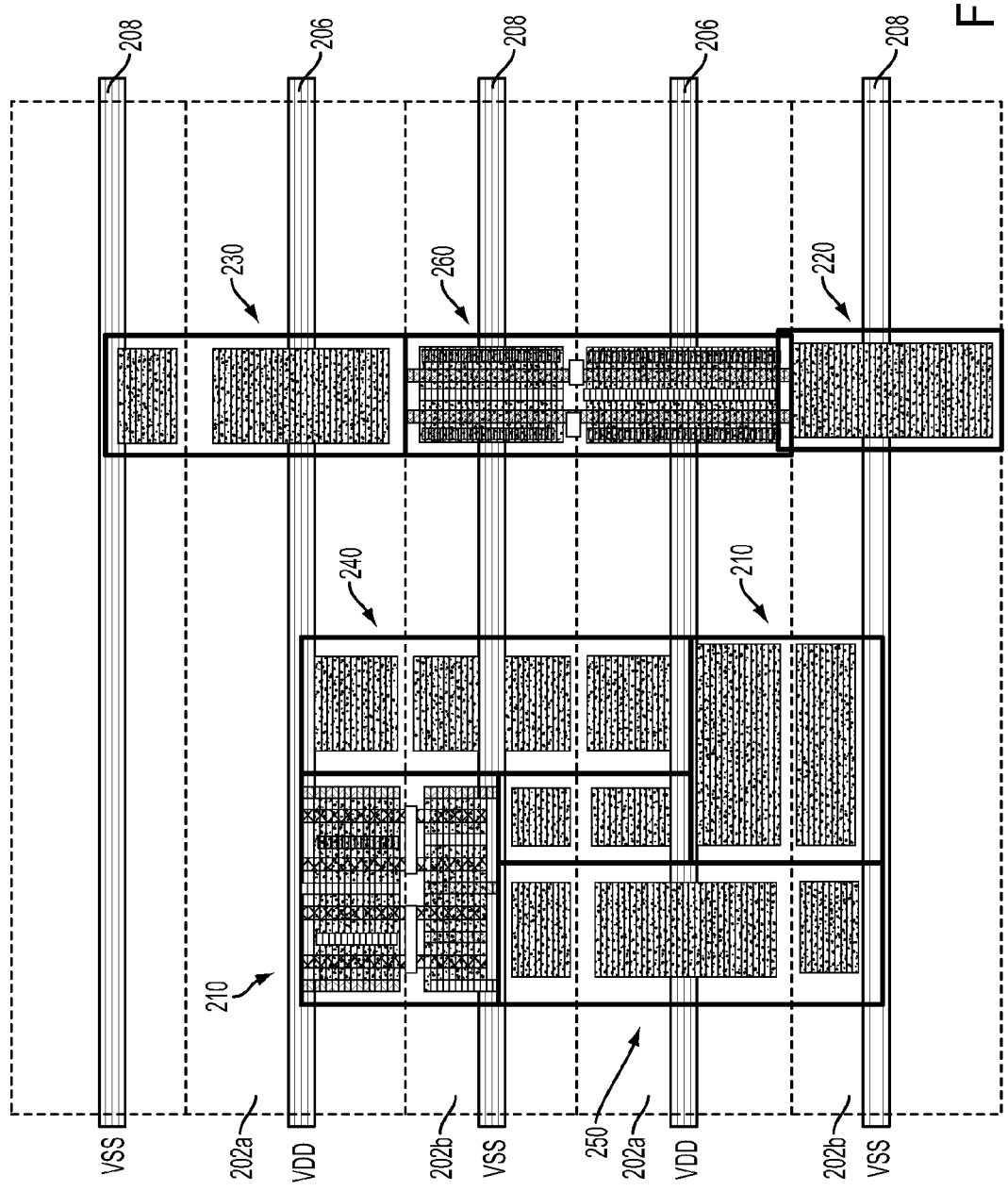
FIG. 3 is a layout diagram of a multi-row mixed track standard cell structure in accordance with one or more embodiments.

FIG. 3 is a layout diagram of a multi-row standard cell structure in accordance with one or more embodiments. A combination of single size cells (i.e., the first standard cells 210), 1.5 size cells (i.e., the second standard cells 220 and 230) and the 2.0 size cells (i.e., the third standard cells 240, 250 and 260) are included in the multi-row standard cell structure. The combination of the cells 210 through 260, enable a greater design variety within the cell library and increased packing density during the layout design process. Because there is a four track (4T) unit difference between the cells in the multi-row cell structure, the OD regions of each cell are fully utilized.

As further shown in FIG. 3, several first standard cells 210 are combined with cells 240 and 250. According to an embodiment, the third standard cell 260 is complementary in area to the second standard cells 220 and 230 disposed in adjacent rows of the multiple rows, thereby avoiding area waste. Place and Route tools will have more flexibility selecting appropriate driving cells with small area. The third standard cell 260 and the second standard cells 220 and 230 are aligned vertically within adjacent rows of the multiple rows.

One or more embodiments of the present disclosure enhance chip performance and/or area utilization by using a mixed track standard cell library for enhancing the layout of standard cells which typically suffer from power rail and N well abutment constraints.

One or more embodiments of the present disclosure include an integrated circuit layout having a mixed track standard cell configuration comprising first well regions of a predetermined height and a second well regions of a predetermined height, the first and second well regions are alternately arranged within a substrate, first conductors and second conductors alternately arranged and extending across regions of corresponding first and second well regions, and a plurality of standard cells in multiple rows. The standard cells comprising a first standard cell having a first cell height substantially equal to $I(X+Y)+X$ or Y, wherein X is one half the predetermined height of the first well region, Y is one half the predetermined height of the second well region, and I is a positive integer.

One or more embodiments of the present disclosure also include an integrated circuit layout having a mixed track standard cell configuration comprising a first well regions of a predetermined height and a second well regions of a predetermined height, the first and second well regions are alternately arranged within a substrate, first conductors and second conductors alternately arranged and extending across regions of corresponding first and second well regions, and a plurality of standard cells in multiple rows. The standard cells comprising a plurality of first standard cells, each having a first cell height substantially equal to $I(X+Y)+X$ or Y, wherein X is one half the predetermined height of the first well region, Y is one half the predetermined height of the second well region, and I is a positive integer.

One or more embodiments of the present disclosure further include an integrated circuit layout having a mixed track standard cell configuration comprising a first well regions of a predetermined height and a second well regions of a predetermined height, the first and second well regions are alternately arranged within a substrate, first conductors and second conductors alternately arranged and extending across regions of corresponding first and second well regions, and a plurality of standard cells in multiple rows. The standard cells comprise a first standard cell having a first cell boundary abutting a boundary of the first well region or second well region, and a second cell boundary abutting the first conductor or the second conductor.

The above illustrations show many different embodiments or embodiments for implementing different features of the disclosure. Specific embodiments of components help clarify the disclosure. These are, of course, embodiments and are not intended to limit the disclosure from that described in the claims.

Although the disclosure is illustrated and described herein as embodied in one or more specific examples, it is nevertheless not intended to be limited to the details shown, since various modifications and structural changes may be made therein without departing from the spirit of the disclosure and within the scope and range of equivalents of the claims. For example, the various transistors being shown as a particular type (e.g., NMOS, PMOS, etc.) are also for illustration, various embodiments of the invention are not limited to a particular type, but the particular type selected for a transistor is also a design choice and is within the scope of various embodiments. Accordingly, it is appropriate that the claims be construed broadly and in a manner consistent with the scope of the disclosure.

What is claimed is:

1. An integrated circuit layout having a mixed track standard cell configuration comprising:
    first well regions of a first predetermined height and second well regions of a second predetermined height, the first and second well regions arranged within a substrate;
    first conductors and second conductors extending across the corresponding first and second well regions; and
    a plurality of standard cells in multiple rows, the plurality of standard cells comprising:
        a first standard cell having a first cell height substantially equal to $I(X+Y)+X$ or $I(X+Y)+Y$, wherein X is one half the first predetermined height, Y is one half the second predetermined height, and I is a positive integer.

2. The integrated circuit layout of claim 1, further comprising:
    a second standard cell having a second cell height substantially equal to $2(X+Y)$.

3. The integrated circuit layout of claim 2, wherein the first and second standard cells each comprise:
    a plurality of transistor regions including a first transistor region of a first type and a second transistor region of a second type.

4. The integrated circuit layout of claim 3, further comprising:
    a third standard cell having a third cell height substantially equal to $(X+Y)$, wherein a height of a first transistor region of the third standard cell is substantially equal to X and a height of a second transistor region of the third standard cell is substantially equal to Y.

5. The integrated circuit layout of claim 3, wherein a height of the first transistor region of the first standard cell is greater or less than a height of the second transistor region of the first standard cell.

6. The integrated circuit layout of claim 3, wherein a height of the first and second transistor regions of the second standard cell are substantially equal to each other.

7. The integrated circuit layout of claim 3, wherein the second standard cell is complementary in area to the first standard cell, and the second standard cell and the first standard cell are aligned vertically within adjacent rows of the multiple rows.

8. The integrated circuit layout of claim 4, wherein the third cell height ranges from approximately 8 tracks to approximately 20 tracks, and the heights of the first and second transistor regions of the third standard cell are substantially equal to each other.

9. An integrated circuit layout having a mixed track standard cell configuration comprising:
    first well regions of a first predetermined height and second well regions of a second predetermined height, the first and second well regions arranged within a substrate;
    first conductors and second conductors extending across the corresponding first and second well regions; and
    a plurality of standard cells in multiple rows, the plurality of standard cells comprising:
        a plurality of first standard cells, each having a first cell height-substantially equal to $I(X+Y)+X$ or $I(X+Y)+Y$, wherein X is one half the first predetermined height, Y is one half the second predetermined height, and I is a positive integer.

10. The integrated circuit layout of claim 9, further comprising:
    a plurality of second standard cells, each having a second cell height substantially equal to $2(X+Y)$.

11. The integrated circuit layout of claim 10, wherein the first and second standard cells each comprise:
    a plurality of transistor regions including a first transistor region of a first type and a second transistor region of a second type.

12. The integrated circuit layout of claim 11, further comprising:
    a plurality of third standard cells having a third cell height substantially equal to $(X+Y)$, wherein a height of a first transistor region of each of the plurality of third standard cells is substantially equal to X and a height of a second transistor region of each of the plurality of third standard cells is substantially equal to Y.

13. The integrated circuit layout of claim 11, wherein a height of the first transistor region of each of the plurality of first standard cells is greater or less than a height of the second transistor region of each of the plurality of first standard cells.

14. The integrated circuit layout of claim 12, wherein the third cell height ranges from approximately 8 tracks to approximately 20 tracks, and the height of the first and second transistor regions of each of the plurality of third standard cells are substantially equal to each other.

15. An integrated circuit layout having a mixed track standard cell configuration comprising:
    first well regions of a first predetermined height and second well regions of a second predetermined height, the first and second well regions arranged within a substrate;
    first conductors and second conductors extending across the corresponding first and second well regions; and
    a plurality of standard cells in multiple rows, the plurality of standard cells comprising:
        a first standard cell having
            a first uppermost or lowermost cell boundary abutting a boundary of one of the first well regions or one of the second well regions, and
            a second uppermost or lowermost cell boundary abutting one of the first conductors or one of the second conductors.

16. The integrated circuit layout of claim 15, further comprising:
    a second standard cell having
        a first uppermost or lowermost cell boundary abutting a boundary of one of the first well regions or one of the second well regions and a second uppermost or lowermost cell boundary abutting a boundary of another one of the first well regions or another one of the second well regions.

17. The integrated circuit layout of claim 16, wherein the second standard cell is complementary in area to the first standard cell, and the second standard cell and the first standard cell are aligned vertically within adjacent rows of the multiple rows.

18. The integrated circuit layout of claim 16, further comprising:
   a third standard cell having
      a first cell boundary abutting one of the first conductors, and
      a second cell boundary abutting one of the second conductors.

19. The integrated circuit layout of claim 16, wherein the first standard cell has a first cell height substantially equal to $I(X+Y)+X$ or $I(X+Y)+Y$, wherein X is one half the first predetermined height, Y is one half the second predetermined height, and I is a positive integer.

20. The integrated circuit layout of claim 19, wherein the second standard cell has a second cell height substantially equal to $2(X+Y)$.

* * * * *